United States Patent
Yamagata et al.

(10) Patent No.: US 10,615,096 B2
(45) Date of Patent: Apr. 7, 2020

(54) HEAT DISSIPATION STRUCTURE FOR ELECTRIC CIRCUIT DEVICE

(71) Applicant: Denka Company Limited, Tokyo (JP)

(72) Inventors: Toshitaka Yamagata, Omuta (JP); Saori Inoue, Omuta (JP); Hideki Hirotsuru, Omuta (JP); Ryoh Yoshimatu, Omuta (JP); Ryuji Koga, Omuta (JP)

(73) Assignee: DENKA COMPANY LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 16/322,570

(22) PCT Filed: Aug. 2, 2017

(86) PCT No.: PCT/JP2017/028133
§ 371 (c)(1),
(2) Date: Feb. 1, 2019

(87) PCT Pub. No.: WO2018/025933
PCT Pub. Date: Feb. 8, 2018

(65) Prior Publication Data
US 2019/0189534 A1 Jun. 20, 2019

(30) Foreign Application Priority Data
Aug. 2, 2016 (JP) ................ 2016-152205

(51) Int. Cl.
*H01L 23/40* (2006.01)
*H01L 23/373* (2006.01)
*H01L 23/473* (2006.01)

(52) U.S. Cl.
CPC ...... *H01L 23/3733* (2013.01); *H01L 23/3731* (2013.01); *H01L 23/3737* (2013.01); *H01L 23/4006* (2013.01); *H01L 23/473* (2013.01)

(58) Field of Classification Search
CPC combination set(s) only.
See application file for complete search history.

(56) References Cited

U.S. PATENT DOCUMENTS

2013/0139524 A1* 6/2013 Kim .................. F25B 21/02
62/3.7
2016/0115343 A1  4/2016 Takahara et al.

FOREIGN PATENT DOCUMENTS

EP  3 035 778 A1  6/2016
JP  2003-168772 A  6/2003
(Continued)

OTHER PUBLICATIONS

The Extended European Search Report dated Jul. 2, 2019, issued in corresponding application No. 17837035.9.
(Continued)

*Primary Examiner* — Moin M Rahman
(74) *Attorney, Agent, or Firm* — Sughrue Mion, PLLC

(57) ABSTRACT

Provided is a heat dissipation structure for an electric circuit device excellent in mass-productivity and heat radiation performance. A heat dissipation structure for an electric circuit device, the structure including a layered structure comprising: a heatsink exposed on the electric circuit device; a thermal conductive member; and a cooler, wherein the thermal conductive member is a ceramic-resin composite in which a resin composition is impregnated in a ceramic sintered body, the ceramic sintered body comprising ceramic primary particles integrated into a three-dimensional structure, and wherein the thermal conductive member is arranged such that the thermal conductive member directly contacts with at least one of the heatsink and the cooler.

4 Claims, 1 Drawing Sheet

(56) References Cited

FOREIGN PATENT DOCUMENTS

| | | | |
|---|---|---|---|
| JP | 2005-150420 | A | 6/2005 |
| JP | 2010-192717 | A | 9/2010 |
| JP | 2015-096456 | A | 5/2015 |
| JP | 2016-111171 | A | 6/2016 |
| WO | 2014/199650 | A1 | 12/2014 |

OTHER PUBLICATIONS

International Search Report for PCT/JP2017/028133 dated Sep. 26, 2017 [PCT/ISA/210].

* cited by examiner

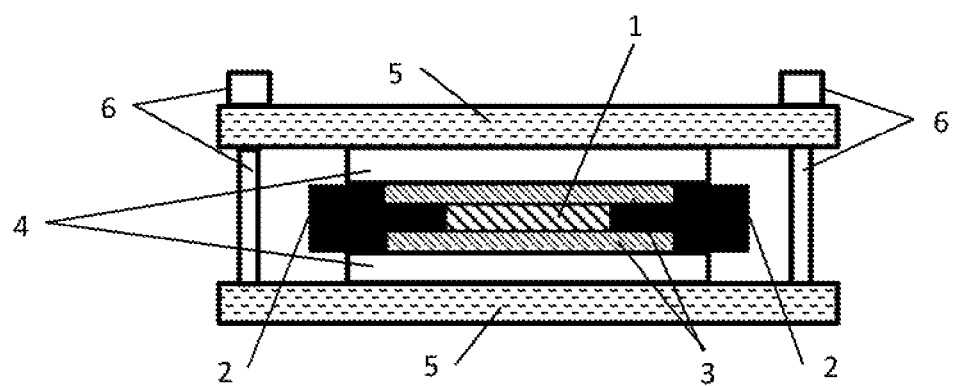

HEAT DISSIPATION STRUCTURE FOR ELECTRIC CIRCUIT DEVICE

CROSS REFERENCE TO RELATED APPLICATIONS

This application is a National Stage of International Application No. PCT/JP2017/028133 filed Aug. 2, 2017, claiming priority based on Japanese Patent Application No. 2016-152205 filed Aug. 2, 2016.

TECHNICAL FIELD

The present invention relates to a heat dissipation structure for an electric circuit device.

BACKGROUND

Power modules are well-known electric circuit devices in the art. The power modules typically comprise an encapsulated package including a power semiconductor component, such as power MOSFETs and insulated gate bipolar transistors (IGBT), wired on a ceramic substrate. The electric circuit devices have been used as, for instance, an electric module for controlling electric power, e.g., an electric module for controlling a vehicle traction motor. Since the power semiconductor components manage high power, they are also known as a heat generator. So there has been conventional, various heat dissipation structures, also referred to as cooling structures or packaging structures, for power modules.

Some simple power modules have a heat dissipation structure to dissipate heat from the rear surface of a power device. Patent Document 1 discloses, for example, a conventional heat dissipation structure for power modules, comprising a heatsink located on the rear surface of a power module and a cooler such as an aluminum cooler fixed to the heatsink by a screw via thermal grease as a thermal conductive member such as silicone grease.

To follow downsizing and increasing power consumption of power modules, Patent Document 2 discloses a conventional heat dissipation structure comprising heatsinks exposed on both surfaces of a heat generator to increase the heat radiation area. The conventional structure further comprises an electric-insulating and thermal-conductive member (i.e., dielectric plate) and a cooler on the heatsinks via thermal grease or thermal conductive gel. The dielectric plate and the cooler are compressed onto the heatsink with an appropriate pressure to make them thermally contact each other. The thermal-conductive member itself located between the heatsink and the cooler is required to have a high thermal conductivity, and the thermal-conductive member electrically insulates the heatsink from the cooler. So, if the thermal grease which works to adhere to the heatsink and the cooler is not dielectric, the thermal-conductive member needs additional insulating material. Patent Document 2 discloses that the conventional heat dissipation structure would have the thermal resistance of 0.24 K/W or less to increase heat radiation performance.

Patent Document 3 discloses a conventional heat dissipation structure for power modules, comprising a layer containing whiskers, that may be carbon nanotubes or carbon filaments, aligned along the axis perpendicular to the heat radiation surface, i.e., the thermal conducting direction, to improve conventional heat dissipation members. However, the structure of Patent Document 3 has introduced a certain drawback that the whisker layer is fragile and the structure is difficult to mass-produce.

The conventional thermal conductive material often utilizes ceramic from the viewpoint of both dielectricity and thermal conductivity. However, since the ceramic material is rigid and has the solid surface, it is difficult to contact with an adherend. Even if the ceramic material is located, as a thermal conductive member, between a heatsink and a cooler and they are compressed together to adhere each other, there are air gaps at their interfaces, and the gaps spoil the heat conductivity. Therefore, the conventional art requires a layer of thermal grease to fill the gaps at the interfaces. Specifically, the conventional heat dissipation structure needs layers of thermal grease on both the interface between the heatsink and the thermal conductive member and the interface between the thermal conductive member and the cooler. Even if the provided thermal grease layers partially improved the thermal conductivity of the conventional heat dissipation structure, the grease layers themselves would typically have a thermal conductivity lower than that of the thermal conductive member, and the conventional structure requires two grease layers. Thus, even with using grease layers of the thinnest thickness, the whole conventional structure could stand further improvement on its thermal conductivity. Additionally, the conventional structure must require a process of proving thermal grease layers.

CITATION LIST

Patent Literature

Patent Document 1: Japanese Patent Laid-Open No. 2003-168772
Patent Document 2: Japanese Patent Laid-Open No. 2005-150420
Patent Document 3: Japanese Patent Laid-Open No. 2010-192717

SUMMARY OF INVENTION

Technical Problem

Concerning the problems above, the present invention aims to provide a heat dissipation structure excellent in both mass-productivity and heat dissipation performance.

The present invention can provide the following aspects 1 to 5 to solve the problem above.

1. A heat dissipation structure for an electric circuit device, the structure including a layered structure comprising:
    a heatsink exposed on the electric circuit device;
    a thermal conductive member; and
    a cooler,
    wherein the thermal conductive member is a ceramic-resin composite in which a resin composition is impregnated in a ceramic sintered body, the ceramic sintered body comprising ceramic primary particles integrated into a three-dimensional structure, and
    wherein the thermal conductive member is arranged such that the thermal conductive member directly contacts with at least one of the heatsink and the cooler.
2. Preferably, the heat dissipation structure according to Aspect 1 may be characterized in that the ceramic-resin composite comprises:
    35 to 70% by volume of the ceramic sintered body comprising boron nitride primary particles integrated into a three-dimensional structure, wherein the boron nitride primary particles have a mean particle diameter of 3 to 60 microns and an aspect ratio of 5 to 30; and 65 to 30% by volume of the resin composition impregnated in the ceramic sintered body.
3. Preferably, the heat dissipation structure according to Aspect 1 or 2 may be characterized in that the thermal conductive member is a plate having a thickness of 0.05 mm to 1.0 mm.
4. Preferably, the heat dissipation structure according to any one of Aspects 1 to 3 may be characterized in that the electric circuit device comprises at least two heatsinks, wherein the heatsinks face each other and sandwich a heat generator, and wherein each heatsink comprises an exposed surface.
5. Preferably, the heat dissipation structure according to any one of Aspects 1 to 4 may be characterized in that a pressure is applied on the layered structure along an axis perpendicular to a laminated surface of the layered structure.

Advantageous Effects of Invention

According to an embodiment of the present invention, a ceramic-resin composite can be used as a thermal conductive member and arranged between a heatsink of a heat generator and a cooler. Thus an embodiment of the present invention can provide a heat dissipation structure for an electric circuit device, excellent in both heat dissipation performance and mass-productivity. Therefore, another embodiment of the present invention can also provide an electric circuit device which thermally protects itself and maintains its electric performance.

BRIEF DESCRIPTION OF DRAWINGS

FIG. 1 exemplifies a schematic view of a heat dissipation structure according to an embodiment of the present invention.

DESCRIPTION OF EMBODIMENTS

In the present specification, a numerical range includes the upper and lower limits thereof unless otherwise defined.

An embodiment of the present invention provides a heat dissipation structure for an electric circuit device, and the structure includes an exposed heatsink open to the outside and a cooler arranged by the heatsink via a thermal conductive member. The thermal conductive member directly contacts with at least one of the heatsink and the cooler and makes a layered structure. The thermal conductive member is a ceramic-resin composite in which a resin composition is impregnated in a ceramic sintered body, and the ceramic sintered body comprises ceramic primary particles integrated into a three-dimensional structure.
Electric Circuit Devices In the present specification, the term "electric circuit device" means a device comprising a heat generator, and a heatsink arranged by or contacted with the heat generator, where the heatsink has the exposed surface open to the outside. The electric circuit device may typically be covered or encapsulated with an encapsulant entirely, except for external connection terminals and the exposed surface of the heatsink. The electric circuit device may include, but not limited to, a power module. Additionally, in the present specification, the electric circuit device may comprehensively include an integrated apparatus having a heat generator therein and a heatsink with the exposed surface, not only power modules.
Heat Generators In the present specification, the term "heat generator," as included in an electric circuit device, means an element or device which can produce some heat when it passes electric current therethrough in operation. The present invention can use any active elements or passive elements as the heat generator. For instance, the present invention may closely relate to and use, but not limited to, power semiconductor devices for controlling electricity, e.g., for drive control or power convention of motors or lighting apparatuses. The power semiconductor devices may include, for instance, power MOSFETs, IGBTs, thyristors, and SiC devices.
Heatsinks In the present specification, the term "heatsink" means a plate or the like good in thermal conductivity and electric conductivity, which may be arranged by or contacted with a heat generator in an electric circuit device. The heatsink has the exposed surface open to the outside to discharge heat from the heat generator. The heat sink may be made of a metal such as copper alloy and aluminum alloy. In some electric circuit devices, the heatsink may also work as an electrode. In the present invention, the shape of a heatsink, the number of heatsink(s) included in one electric circuit device, and the spatial relationship between a plurality of heatsinks if any are not particularly limited. In typical embodiments, an electric circuit device may have the shape of a plate or a pseudo-plate, and have a heatsink(s) on either or both of the upper and lower surfaces.
Thermal Conductive Member The thermal conductive member according to an embodiment of the present invention is a composite in which a resin composition is impregnated in a ceramic sintered body, where the ceramic sintered body comprises ceramic primary particles integrated into a three-dimensional structure. Hereinafter, the composite is also referred to as "ceramic-resin composite." The ceramic-resin composite may have a layer of thermal grease at the interface between the ceramic-resin composite and the exposed surface of the heatsink or the interface between the ceramic-resin composite and a cooler, unless the layer spoils the performance of a heat dissipation structure according to an embodiment of the present invention.

The ceramic-resin composite may preferably include a sintered body in which ceramic primary particles form an integrated three-dimensional continuous structure, where the primary particles are one or more selected from boron nitride, aluminum nitride, and silicon nitride. Hereinafter, the sintered body is referred to as "ceramic primary particle sintered body." If the ceramic primary particle is boron nitride, the sintered body may also be referred to as "boron nitride primary particle sintered body." If the ceramic primary particle is aluminum nitride, the sintered body may also be referred to as "aluminum nitride primary particle sintered body." If the ceramic primary particle is silicon nitride, the sintered body may also be referred to as "silicon nitride primary particle sintered body." Particularly, in the case that the ceramic primary particle is boron nitride primary particle, the ceramic-resin composite may preferably comprise 35 to 70% by volume, more preferably 40 to 65% by volume of a ceramic sintered body and 65 to 30% by volume, more preferably 60 to 35% by volume of a resin composition, more preferably a thermosetting resin composition, impregnated into the ceramic sintered body. The ceramic sintered body may preferably comprise boron nitride primary particles integrated into a three-dimensional structure, where the primary particles have 3 to 60 microns of the mean particle diameter and 5 to 30 of the aspect ratio. If the content of the ceramic sintered body in the ceramic-resin composite is less than 35% by volume, the heat conductivity of the whole thermal conductive member gets worse since the content of the resin composition increases and the resin composition has a relatively low heat conductivity. If the content of the ceramic sintered body in the ceramic-resin composite is more than 70% by volume, the tensile shear adhesion strength and the thermal conductivity may be deteriorated since a thermosetting resin composition is difficult to impregnate into bumps on the surface of a heatsink when a thermal conductive member adheres to the heatsink or a cooler by a heat-pressing.

To obtain a ceramic sintered body comprising boron nitride primary particles integrated into a three-dimensional structure, the following process may work: adding 0.01 to 20% by mass, typically 0.01 to 10% by mass, more typically 1 to 5% by mass of a sintering additive, such as calcium carbonate, sodium carbonate, and boric acid, to a powder of boron nitride primary particles; forming the mixture by a known method such as a molding and a cold isostatic pressing (CIP) method; and then sintering the formed mixture at a temperature of 1,500 to 2,200 degrees C. for about 1 to 30 hours in a non-oxidizing atmosphere such as nitrogen and argon.

The sintering may be carried out by a furnace such as batch furnaces and continuous furnaces. The batch furnaces may include a muffle furnace, a tubular furnace, and an atmospheric furnace. The continuous furnaces may include a rotary kiln, a screw conveyor furnace, a tunnel furnace, a belt furnace, a pusher furnace, and a continuous vertical furnace. They are used in accordance with a purpose. For instance, a batch furnace may be preferable to produce various boron nitride sintered bodies by a small amount each. A continuous furnace may be preferable to produce a large amount of a certain boron nitride sintered body.

The content of a resin composition in the ceramic-resin composite may preferably be 30 to 65% by volume based on the volume of a thermal conductive member, more preferably 35 to 60% by volume. The content of a resin composition in the ceramic-resin composite may be calculated from the weights of a ceramic and a resin before and after combining them and the specific gravity values thereof. The resin composition may include a thermosetting resin composition.

Preferably, the thermosetting resin composition may include, for instance, the combination of at least one of a substance having an epoxy group and a substance having a cyanate group and at least one of a substance having a hydroxy group and a substance having a maleimide group. Among these, more preferred is the combination of a substance having a cyanate group and a substance having a maleimide group.

A substance having an epoxy group may include, but not limited to, epoxy resins such as bisphenol A epoxy resins, bisphenol F epoxy resins, polyfunctional epoxy resins (e.g., cresol novolac epoxy resins and dicyclopentadiene epoxy resins), phenolic novolac epoxy resins, cyclic aliphatic epoxy resins, glycidyl ester epoxy resins, and glycidyl amine epoxy resins.

A substance having a cyanate group may include, but not limited to, cyanate resins such as 2,2'-bis(4-cyanatophenyl) propane, bis(4-cyanato-3,5-dimethylphenyl)methane, 2,2'-bis(4-cyanatophenyl)hexafluoropropane, 1,1'-bis(4-cyanatophenyl)ethane, and 1,3-bis(2-(4-cyanatophenyl)isopropyl) benzene.

A substance having a hydroxy group may include, but not limited to, phenols such as phenolic novolac resins and 4,4'-(dimethylmethylene)bis[2-(2-propenyl)phenol]. A substance having a maleimide group may include, but not limited to, maleimide resins such as 4,4'-diphenylmethane bismaleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenylsulfone bismaleimide, 1,3-bis (3-maleimidophenoxy)benzene, 1,3-bis (4-maleimidophenoxy) benzene, bis-(3-ethyl-5-methyl-4-maleimidophenyl)methane, and 2,2'-bis[4-(4-maleimidophenoxy)phenyl]propane.

The ceramic-resin composite may also contain a silane coupling agent for improving the adhesion between a ceramic and a resin composition. The ceramic-resin composite may further contain a defoaming agent, a surface modifier, and a wet dispersant for improving the wettability and leveling property and lowering the viscosity to reduce the occurrence of defects during impregnation or a curing process. The composite may also contain a curing accelerator to control the curing rate and the initial heating temperature. The curing accelerator may include, but not limited to, imidazoles such as 2-ethyl-4-methylimidazole and 2-phenylimidazole; organic phosphorus compounds such as triphenylphosphine and tetraphenylphosphonium tetra-p-tolylborate; and metal catalysts such as acetylacetone copper(II) and zinc(II) acetylacetonate.

A ceramic-resin composite is made from a combination of the ceramic and the resin composition, e.g., by impregnating the resin composition into a ceramic primary particle sintered body. The impregnation may be carried out by, for instance, vacuum impregnation and/or pressure impregnation with 1 to 300 MPa(G). The pressure for the vacuum impregnation may preferably be 1000 Pa(abs) or less, more preferably 100 Pa(abs) or less. The pressure impregnation may be insufficient at a pressure of less than 1 MPa(G) since a resin composition may not be impregnated well into the interior of a ceramic primary particle sintered body. The pressure impregnation may be too costly at a pressure of more than 300 MPa(G) since it requires a large facility. The vacuum impregnation and the pressure impregnation may involve a heating process at a temperature of 100 to 180 degrees C. to reduce the viscosity of a resin composition for promoting the impregnation of a resin composition into a boron nitride primary particle sintered resin.

If the resin composition is thermosetting, the thermosetting resin composition may preferably be partially cured, i.e., be converted to B-stage resin. The partially-curing may be carried out by any heating such as infrared heating, hot air circulation, oil heating, hot plate heating, or a combination thereof. The partially-curing may be carried out by a heating function of an impregnation device after a thermosetting resin composition is impregnated therein. Alternatively, the partially-curing may be separately carried out by a known apparatus such as a hot air circulation conveyor furnace after the resin is taken from an impregnation device.

In an embodiment of the present invention, the ceramic-resin composite may further include a layer of thermal grease at the interface between the ceramic-resin composite and the exposed surface of the heatsink, or at the interface between the ceramic-resin composite and the cooler, as long as the properties of the present heat dissipation structure are not spoiled. The thermal grease may include a silicone resin with a thermal conductive filler, e.g., having the heat conductivity of 1 to 5 W/(m·K). The grease may be applied onto the surface of a ceramic-resin composite. The coating thickness may preferably be 20 to 100 microns. Applying thermal grease onto a thermal conductive member may improve the heat conductivity of a heat dissipation structure, since a ceramic-resin composite may more close contact with a heatsink or a cooler. In an alternative embodiment, a heat dissipation structure may include one layer of thermal grease on one heatsink and may not have any thermal grease layers on another heatsink. In a still further embodiment, a heat dissipation structure may lack any thermal grease layers.

The thickness of a thermal conductive member may vary depending on desired electric and thermal properties of a heat dissipation structure for an electric circuit device. The thermal conductive member may be formed in a sheet having a given thickness by using a multi-wire saw such as "MWS-32N" manufactured by Takatori Corporation. For reducing the thermal resistance, The thermal conductive member may be formed in a thin sheet with the thickness of 0.1 mm to 0.35 mm.

Coolers

A cooler may typically be made of a metal, preferably of molded aluminum. The cooler may preferably have the surface suitable for contact with a thermal conductive member. The cooler is not limited to have any shapes or internal constructions; the cooler may have a liquid-cooling mechanism in which a cooling liquid flows therein, or an air-cooling mechanism with a cooling fin.

According to an embodiment of the present invention, a heat dissipation structure may include a thermal conductive member contacted with the exposed surface of a heatsink of an electric circuit device, and a cooler which is not directly contacted with the heatsink and is contacted with the thermal conductive member. The electric circuit device may have two or more heatsinks that face each other and sandwich a heat generator. In that case, the heatsinks may preferably be arranged parallelly. The present heat dissipation structure may preferably have a laminated structure including a thermal conductive member on each surface of an electric circuit device and a cooler on each thermal conductive member. For closely adhering a cooler onto an electric circuit device to improve the cooling (heat-radiating) properties, the present heat dissipation structure may preferably include a structure for applying a pressure on the layered surface along an axis perpendicular to the laminated surface of the layered structure such that the electric circuit device and the thermal conductive member are bundled and strongly fastened; i.e., the structure may use a compressive load or pressure. Preferably, the compressive load may be applied on the whole of the laminated surface. The compressive load may be used by any methods, preferably that shown in FIG. 1—drilling coolers; attaching a fastening member with a bolt or a nut; making the coolers face and pull against each other by the fastening member (e.g., via a screw) to apply a compressive load.

EXAMPLES

Hereinafter, the present invention will be explained in detail by the following experiment examples and comparative examples; however, the provided explanation merely intends to clarify the present invention and advantages thereof, not to limit the present invention.

As preparation for making structures according to the examples and comparative examples, the following electric circuit device, thermal conductive member, thermal grease, and cooler were provided. Their overview is shown in Table 1.

Electric Circuit Device

Provided was a power module with dual cooling surfaces, having heatsinks on both the upper and the lower surfaces. Each heatsink was a rectangular flat plate of 35 mm long×21 mm width. The power module had the calorific power of 310 W. Hereinafter, the power module is referred to as "electric circuit device A."

Thermal Conductive Member

Provided was a ceramic-resin composite sheet made by impregnating a resin composition to a ceramic sintered body comprising boron nitride primary particles integrated into a three-dimensional structure. The composite sheet is referred to as "thermal conductive member B." The thermal conductive member B had the heat conductivity of 80 W/(m·K).

Ceramic-resin Composite

The ceramic-resin composite was made by impregnating a thermosetting resin composition to a boron nitride sintered body comprising boron nitride primary particles integrated into a three-dimensional structure. The boron nitride sintered body was made by the following process. Boron nitride (mean particle diameter: 18 microns, aspect ratio: 12), boron nitride (mean particle diameter: 6 microns, aspect ratio: 15), boric acid, and calcium carbonate were mixed in the mass ratio of 64.2:34.0:1.2:0.6. The mixture was wet-mixed with ethanol in a ball mill made of silicon nitride for 2 hours. The mixture was dried and crushed to obtain a mixture powder. The mixture powder was filled into a mold and pressed by a pressure of 5 MPa to obtain a block. The block was further pressed with 75 MPa(G) using a CIP (cold isostatic pressing) apparatus, "ADW 800" manufactured by KOBE STEEL, LTD. The pressed block was sintered in a batch high-frequency furnace ("FTH-300-1H" manufactured by Fujidempa Kogyo Co., Ltd.) at 2000 degrees C. for 10 hours, under the nitrogen flow rate of 10 L/min to obtain the boron nitride sintered body. The specific gravity of the boron nitride sintered body was 1.51. The boron nitride sintered body was cut into a sheet of 45 mm long×35 mm width×0.32 mm thick. The sheet was put in a vacuum heating and impregnation device ("G-555AT-R" manufactured by KYOSIN ENGINEERING) at 145 degrees C. and 15 Pa(abs), and evaporated for 10 minutes and impregnated with a thermosetting resin composition for 10 minutes. The thermosetting resin composition was the mixture of 12.1 mass % of bisphenol F epoxy resin ("JER807" manufactured by Mitsubishi Chemical; specific gravity: 1.2), 72 mass % of novolac cyanate resin ("PT-30" manufactured by Lonza; specific gravity: 1.2), 7.9 mass % of phenolic novolac resin ("TD-2131" manufactured by DIC; specific gravity: 1.2), and 8 mass % of bis-(3-ethyl-5-methyl-4-maleimidephenyl) methane (specific gravity: 1.3). Then the boron nitride sintered body which had been impregnated with the thermosetting resin composition was put into a pressure heating and impregnation device ("HP-4030AA-H45" manufactured by KYOSIN ENGINEERING) at 145 degrees C. and 3.5 MPa for 120 minutes, and heated at the atmospheric pressure and 160 degrees C. for 120 minutes to obtain a ceramic-resin composite sheet in which the thermosetting resin composition was partially cured. The resulted sheet contained the combination of the boron nitride sintered body and the resin composition. Hereinafter, the sheet is also referred to as "boron nitride-resin composite sheet." The size of the ceramic-resin composite was substantially the same as that of the original boron nitride sintered body. The volume ratio of the boron nitride sintered body and the resin composition was 52:48. The volume ratio was calculated from the weights of the ceramic and the resin before and after combining them and the specific gravity values thereof.

Thermal Grease

Provided was thermal grease with the heat conductivity of 2 W/(m·K), "G-765" manufactured by Shin-Etsu Chemical Co., Ltd. The grease is referred to as "thermal grease C."

Cooler

Provided was a water-cooling device made of aluminum, in the shape of a plate which had the surface of 50 mm×30 mm for contacting the thermal conductive member and the thickness of 5 mm and the heat conductivity of 200 W/(m·K). The cooling device is referred to as "cooler D."

TABLE 1

| | | |
|---|---|---|
| electric circuit device A | calorific power | 310 W |
| | dimension of heatsink | The device has the heatsinks on both the upper and lower surfaces. Each heatsink is a rectangular plate and has the size of 35 mm long × 21 mm width. |
| thermal conductive member B | heat conductivity | 80 W/(m · K) |
| | ceramic sintered body | ceramic sintered body comprising ceramic primary boron nitride particles integrated in a three-dimensional structure |
| | resins | 12.1 mass % of bisphenol F epoxy resin, "JER807" manufactured by Mitsubishi Chemical; 72 mass % of novolak cyanate resin, "PT-30" manufactured by Lonza; 7.9 mass % of phenolic novolak resin, "TD-2131" manufactured by DIC; and 8 mass % of bis-(3-ethyl-5-methyl-4-maleimidephenyl)methane |
| | dimension heating surface | 45 mm long × 35 mm width |
| | thickness | 0.32 mm |
| thermal grease C | heat conductivity | 2 W/(m · K) |
| | dimension heating surface etc. | as the same as the dimension of the thermal conductive member |
| | coating thick. | 20 μm |
| | product name | "G-765", manufactured by Shin-Etsu Chemical Co, Ltd. |
| cooler D | heat conductivity | 200 W/(m · K) |
| | dimension heating surface etc. | 50 mm long × 30 mm width |
| | thickness | 5 mm |
| | note | water-cooling (water temp. 65° C.; water amount 5 L/minute) |

Example 1

The electric circuit device A and thermal conductive member B (boron nitride-resin composite sheet) were piled up such that their center lines were overlapped and the 35 mm side of the heatsink and the 45 mm side of thermal conductive member B were arranged in parallel. Layers of thermal conductive member B were put on both the upper and lower heatsinks of electric circuit device A, respectively. They were adhered by a press machine at 10 MPa and 200 degrees C. for 24 hours. Then two coolers D were put on both the upper and lower surfaces, respectively, such that the center lines of thermal conductive member B and cooler D were overlapped and the 45 mm side of thermal conductive member B and the 50 mm side of cooler D were arranged in parallel to obtain a heat dissipation structure according to Example 1. A fastening member was attached at the four corners of the two coolers to apply the compressive load of 10 MPa evenly on the layered surface.

Evaluation of Thermal Properties of Heat Dissipation Structure

The thermal resistance of the heat dissipation structure according to Example 1 was evaluated by the following process. Note that the thermal resistance means the thermal resistance [° C./W] at the path between the heatsink and the cooler. The calorific power of electric circuit device A was set to 310 W. The inlet temperature of cooling water for the cooler was set to 65 degrees C. The flow rate of the cooling water was set to 5 L/min. A thermocouple was inserted on the outer surface of the heatsink and the outer surface of the cooler to measure the temperature. The thermal resistance of the whole heat dissipation structure was calculated by the following formula:

thermal resistance [° C./W]=(heatsink temperature [° C.]−cooler temperature [° C.])/310[W]

The layering order, the fastening pressure, and the thermal resistance value of Example 1 are shown in Table 2. Further, the dielectric breakdown strength was measured according to JIS C2110, and the value is shown in Table 2, too.

Example 2

The same process as Example 1 was carried out except that layers of thermal grease C were provided at the interfaces between the heatsinks and thermal conductive members B. The thermal grease C layers had the thickness of 20 microns. The thermal resistance was measured for Example 2 as the same as Example 1. The result is shown in Table 2. The thermal grease C layers were formed by a screen printer.

Example 3

The same process as Example 1 was carried out except that layers of thermal grease C were provided at the interfaces between the thermal conductive members B and the coolers D. The thermal grease C layers had the thickness of 20 microns. The thermal resistance was measured for Example 3 as the same as Example 1. The result is shown in Table 2.

Comparative Example 1

The same process as Example 1 was carried out except that layers of thermal grease C were provided at the two interfaces of the thermal conductive members B and the coolers D. The thermal grease C layers had the thickness of 20 microns. The thermal resistance was measured for comparative example 1 as the same as Example 1. The result is shown in Table 2.

Comparative Example 2

The same process as comparative example 1 was carried out except that the thermal conductive member was replaced with a silicon nitride sintered body to obtain a heat dissipation structure of comparative example 2. Comparative example 2 is an example of a typical, conventional heat dissipation structure. The silicon nitride sintered body was made by cutting a commercially available product ("SN-90" manufactured by MARUWA) such that the size was the same as thermal conductive member B. The layering order and the thermal resistance are shown in Table 2.

Comparing the properties of the present and comparative heat dissipation structures illustrates that the present structures have lower thermal resistances than those of the comparative ones that have two layers of thermal grease C per one surface. The present structures are thus excellent in thermal properties.

TABLE 2

| | | Example 1 | Example 2 | Example 3 | comp. example 1 | comp. example 2 |
|---|---|---|---|---|---|---|
| outline of heat dissipation structure | 9th layer | | | | cooler D | cooler D |
| | 8th layer | | | | thermal grease C (thickness: 20 μm) | thermal grease C (thickness: 20 μm) |
| | 7th layer | | cooler D | cooler D | thermal conductive member B | silicon nitride sintered body |
| | 6th layer | | thermal conductive member B | thermal grease C (thickness: 20 μm) | thermal grease C (thickness: 20 μm) | thermal grease C (thickness: 20 μm) |
| | 5th layer | cooler D | thermal grease C (thickness: 20 μm) | thermal conductive member B | electric circuit device A | electric circuit device A |
| | 4th layer | thermal conductive member B | electric circuit device A | electric circuit device A | thermal grease C (thickness: 20 μm) | thermal grease C (thickness: 20 μm) |
| | 3rd layer | electric circuit device A | thermal grease C (thickness: 20 μm) | thermal conductive member B | thermal conductive member B | silicon nitride sintered body |
| | 2nd layer | thermal conductive member B | thermal conductive member B | thermal grease C (thickness: 20 μm) | thermal grease C (thickness: 20 μm) | thermal grease C (thickness: 20 μm) |
| | 1st layer | cooler D | cooler D | cooler D | cooler D | cooler D |
| | fastening pressure | 10 MPa | — | — | — | — |
| evaluation | thermal resistance | 0.03 K/W | 0.05 K/W | 0.05 K/W | 0.138 K/W | 0.13 K/W |
| | dielectric breakdown strength | 20 kV/mm or more | 20 kV/mm or more | 20 kV/mm or more | 20 kV/mm or more | 12 kV/mm |

INDUSTRIAL APPLICABILITY

A heat dissipation structure according to the present invention can work on power modules for general industrial purpose or vehicles.

REFERENCE SIGNS LIST

1: heat generator, such as power semiconductor components
2: encapsulant
3: heatsink (where components 1 to 3 are integrated into an electric circuit device)
4: ceramic-resin composite
5: cooler
6: fastening member

The invention claimed is:

1. A heat dissipation structure for an electric circuit device, the structure including a layered structure comprising:
  a heatsink exposed on the electric circuit device;
  a thermal conductive member; and a cooler,
  wherein the thermal conductive member is a ceramic-resin composite in which a resin composition is impregnated in a ceramic sintered body, the ceramic sintered body comprising ceramic primary particles integrated into a three-dimensional structure, and wherein the thermal conductive member is arranged such that the thermal conductive member directly contacts with at least one of the heatsink and the cooler,
  wherein the ceramic-resin composite comprises:
    35 to 70% by volume of the ceramic sintered body comprising boron nitride primary particles integrated into a three-dimensional structure, wherein the boron nitride primary particles have a mean particle diameter of 3 to 60 microns and an aspect ratio of 5 to 30; and
    65 to 30% by volume of the resin composition impregnated in the ceramic sintered body.

2. The heat dissipation structure according to claim 1, wherein the thermal conductive member is a plate having a thickness of 0.05 mm to 1.0 mm.

3. The heat dissipation structure according to claim 1, wherein the electric circuit device comprises at least two heatsinks, wherein the heatsinks face each other and sandwich a heat generator, and wherein each heatsink comprises an exposed surface.

4. The heat dissipation structure according to claim 1, wherein a pressure is applied on the layered structure along an axis perpendicular to a laminated surface of the layered structure.

* * * * *